US012803600B2

(12) United States Patent
Kim

(10) Patent No.: US 12,803,600 B2
(45) Date of Patent: Nov. 17, 2026

(54) RF TRANSMITER INTEGRATED CIRCUIT INCLUDING CRYSTAL-LESS VCO AND ELECTRONIC TAG INCLUDING THE SAME

(71) Applicant: 3A Logics Inc., Gyeonggi-do (KR)

(72) Inventor: Sung Wan Kim, Gyeonggi-do (KR)

(73) Assignee: 3A Logics Inc., Gyeonggi-do (KR)

( * ) Notice: Subject to any disclaimer, the term of this patent is extended or adjusted under 35 U.S.C. 154(b) by 253 days.

(21) Appl. No.: 18/757,942

(22) Filed: Jun. 28, 2024

(65) Prior Publication Data

US 2025/0096824 A1 Mar. 20, 2025

(30) Foreign Application Priority Data

Sep. 15, 2023 (KR) ........................ 10-2023-0123017

(51) Int. Cl.
*H04B 1/04* (2006.01)
*H03M 1/66* (2006.01)

(52) U.S. Cl.
CPC ................. *H04B 1/04* (2013.01); *H03M 1/66* (2013.01)

(58) Field of Classification Search
CPC . H04B 1/04; H03M 1/66; H03L 1/026; H03L 7/097; H03L 7/0991
See application file for complete search history.

(56) References Cited

U.S. PATENT DOCUMENTS

| | | | | |
|---|---|---|---|---|
| 4,646,035 A * | 2/1987 | Chapelle | H03L 1/025 | 331/177 R |
| 5,126,699 A * | 6/1992 | Kabler | H03L 1/022 | 331/10 |
| 5,572,169 A * | 11/1996 | Iwamoto | H03L 1/028 | 331/1 R |
| 5,649,320 A * | 7/1997 | Korhonen | H04B 1/405 | 455/260 |
| 5,892,408 A * | 4/1999 | Binder | H03L 1/026 | 331/66 |
| 6,023,198 A * | 2/2000 | McKinney | H03L 1/02 | 331/17 |
| 6,545,550 B1 * | 4/2003 | Frerking | H03L 1/026 | 331/162 |
| 7,579,919 B1 * | 8/2009 | Cao | H03L 7/18 | 331/23 |
| 8,031,024 B1 * | 10/2011 | Zaslavsky | H03L 1/026 | 455/76 |
| 9,306,577 B2 * | 4/2016 | Huang | H03L 7/0995 | |
| 9,608,647 B1 * | 3/2017 | Djahanshahi | H03B 5/1212 | |

(Continued)

*Primary Examiner* — Jinsong Hu
*Assistant Examiner* — Rui M Hu
(74) *Attorney, Agent, or Firm* — Nath, Goldberg & Meyer; Jerald L. Meyer; Stanley N. Protigal

(57) ABSTRACT

The present specification provides a crystal-less radio frequency (RF) transmitter for correcting frequency depending on temperature. The RF transmitter may include: an antenna that transmits an RF signal; a temperature sensor that measures ambient temperature; a digitally controlled oscillator (DCO) that digitally controls an output frequency for the RF signal; a frequency control and locking circuit (FCLC) that performs frequency locking related to correction of the output frequency; a digital-to-analog converter (DAC) that transmits a control voltage to the DCO based on a digital code received from the FCLC; and a memory in which a look up table (LUT) that corrects the output frequency based on the temperature is stored.

5 Claims, 6 Drawing Sheets

(56) References Cited

U.S. PATENT DOCUMENTS

| | | | | |
|---|---|---|---|---|
| 10,454,482 | B2 * | 10/2019 | Pavao Moreira | H03L 1/023 |
| 10,756,671 | B2 * | 8/2020 | Dekoker | H03L 1/022 |
| 2002/0158700 | A1 * | 10/2002 | Nemoto | H03B 5/04 331/158 |
| 2003/0067361 | A1 * | 4/2003 | Takahashi | H03L 7/08 331/176 |
| 2003/0076139 | A1 * | 4/2003 | Miyagawa | H03C 3/0958 327/156 |
| 2004/0232997 | A1 * | 11/2004 | Hein | H03L 1/022 331/16 |
| 2004/0246809 | A1 * | 12/2004 | Sutardja | H03L 7/08 365/232 |
| 2007/0176691 | A1 * | 8/2007 | Batchelor | H03L 7/23 331/16 |
| 2007/0268167 | A1 * | 11/2007 | Ide | H03K 3/0315 341/118 |
| 2010/0141315 | A1 * | 6/2010 | Choi | H03L 7/093 327/159 |
| 2010/0225402 | A1 * | 9/2010 | Yang | H03L 1/022 331/10 |
| 2010/0232623 | A1 * | 9/2010 | Martin | H04R 29/001 381/96 |
| 2011/0012688 | A1 * | 1/2011 | Matsuura | H03C 3/04 332/117 |
| 2011/0121909 | A1 * | 5/2011 | Isohata | H03L 1/027 331/176 |
| 2011/0181367 | A1 * | 7/2011 | Satoh | H03L 1/025 331/34 |
| 2014/0210563 | A1 * | 7/2014 | Akaike | H03L 1/04 331/66 |
| 2015/0052378 | A1 * | 2/2015 | Chen | H03L 7/087 711/103 |
| 2016/0301415 | A1 * | 10/2016 | Waldrip | H03L 7/099 |
| 2017/0063379 | A1 * | 3/2017 | Terasawa | H03L 7/099 |
| 2017/0155393 | A1 * | 6/2017 | Hattori | H03L 1/04 |
| 2017/0194965 | A1 * | 7/2017 | Yonezawa | H03L 7/099 |
| 2017/0331482 | A1 * | 11/2017 | Djahanshahi | H03L 7/113 |
| 2019/0326855 | A1 * | 10/2019 | Uno | H03L 1/025 |
| 2020/0112285 | A1 * | 4/2020 | Dekoker | H03B 5/04 |
| 2020/0274512 | A1 * | 8/2020 | Uehara | H03H 3/04 |
| 2020/0343856 | A1 * | 10/2020 | Aboudina | H03B 5/04 |
| 2023/0291408 | A1 * | 9/2023 | Hazra | H03L 1/00 |
| 2024/0048100 | A1 * | 2/2024 | Itasaka | H03B 5/36 |
| 2024/0113717 | A1 * | 4/2024 | Bahr | H03K 3/0315 |
| 2024/0146243 | A1 * | 5/2024 | Sato | H03B 5/04 |

* cited by examiner

RF TRANSMITER INTEGRATED CIRCUIT INCLUDING CRYSTAL-LESS VCO AND ELECTRONIC TAG INCLUDING THE SAME

CROSS-REFERENCE TO RELATED APPLICATION

This application claims priority to and the benefit of Korean Patent Application No. 2023-0123017, filed on Sep. 15, 2023, the disclosure of which is incorporated herein by reference in its entirety.

BACKGROUND

1. Field of the Invention

The present invention relates to a communication method using a radio frequency (RF) transmitter integrated circuit including a crystal-less (free) voltage controlled oscillator (VCO) and an electronic tag.

2. Discussion of Related Art

A crystal oscillator is an electronic device for generating stable and accurate frequencies, and uses a specific crystal to stably generate frequencies. The crystals may resonate at a certain frequency and maintain a magnetic circuit at a resonance frequency.

In addition, the crystal oscillator may generate an accurate frequency output signal. The output signal may be used as a clock signal, a timing signal, or a frequency reference in other electronic devices.

However, the crystal oscillator may have problems with frequency stability and accuracy when cheap or low-quality crystals are used, and have problems in that a frequency of the crystal oscillator may change according to a change in temperature, a layout of connection circuits is required, and costs may generally be high.

SUMMARY OF THE INVENTION

The present invention is directed to providing a radio frequency (RF) transmitter capable of communicating without a crystal oscillator.

Objects of the present specification are not limited to the above-described objects. That is, other objects that are not mentioned may be obviously understood by those skilled in the art to which the present specification pertains from the following description.

According to an aspect of the present invention, there is provided a crystal-less radio frequency (RF) transmitter for correcting frequency depending on temperature, including: an antenna that transmits an RF signal; a temperature sensor that measures ambient temperature; a digitally controlled oscillator (DCO) that digitally controls an output frequency for the RF signal; a frequency control and locking circuit (FCLC) that performs frequency locking related to correction of the output frequency; a digital-to-analog converter (DAC) that transmits a control voltage to the DCO based on a digital code received from the FCLC; and a memory in which a look up table (LUT) that corrects the output frequency based on the temperature is stored.

The FCLC may close a lock enable switch for the frequency locking based on the temperature, receive a reference frequency from an external reference oscillator (ERO), and generate the digital code based on the reference frequency.

The FCLC may compare the output frequency and the reference frequency to identify a deviation.

The FCLC may fix the digital code based on an absence of the deviation and open the lock enable switch.

The FCLC may store the temperature and the fixed digital code in the memory to generate the LUT.

The FCLC may transmit a digital code corresponding to the ambient temperature to the DAC based on the LUT.

According to another aspect of the present invention, there is provided a method of correcting, by a frequency control and locking circuit (FCLC), a frequency of a crystal-less radio frequency (RF) transmitter depending on temperature, including: closing a lock enable switch for correcting the frequency based on the temperature; receiving a reference frequency from an external reference oscillator (ERO); generating a digital code based on the reference frequency and transmitting the digital code to a digital-to-analog converter (DAC) for controlling a digitally controlled oscillator (DCO); receiving an output frequency from the DCO; comparing the output frequency and the reference frequency to identify a deviation; and fixing the digital code and opening the lock enable switch based on an absence of the deviation.

The method may further include storing the temperature and the digital code to generate a look up table (LUT).

The temperature may increase proportionally from low temperature to high temperature.

The method may further include: measuring ambient temperature through a temperature sensor; identifying the LUT based on the ambient temperature; and transmitting the digital code to the DAC based on the LUT.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
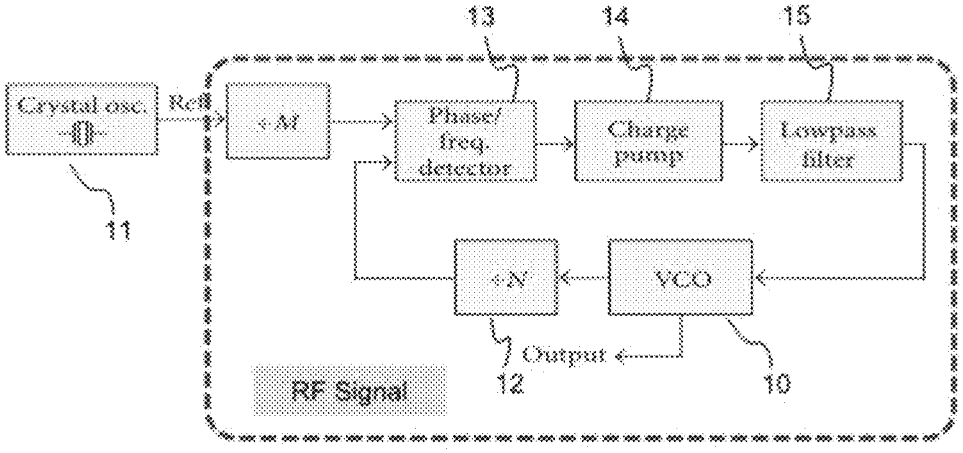
FIG. 1 is a diagram illustrating a phase-locked loop (PLL) structure of a radio frequency (RF) transmitter to which the present specification may be applied.

Objects, features, and advantages of the present specification will become more obvious from the following detailed description provided in relation to the accompanying drawings. However, the present specification may be variously modified and have several exemplary embodiments. Hereinafter, specific exemplary embodiments of the present specification will be illustrated in the accompanying drawings and be described in detail. In principle, same reference numerals denote same constituent elements throughout the specification. In addition, when it is determined that a detailed description for the known functions or configurations related to the present specification may obscure the gist of the present specification, detailed descriptions thereof will be omitted.

Hereinafter, a method and device related to the present specification will be described in more detail with reference to the drawings. In addition, terms "module" and "unit" for components used in the following description are used only to easily make the disclosure. Therefore, these terms do not have meanings or roles that distinguish from each other in themselves.

FIG. 1 is a diagram illustrating a phase-locked loop (PLL) structure of a radio frequency (RF) transmitter to which the present specification may be applied.

A radio frequency (RF) transmitter is a device that transmits information in wireless communications. The phase-locked loop may be used for frequency control and synchronization and may generate and maintain a stable frequency and phase that matches an input signal.

Referring to FIG. 1, a voltage controlled oscillator (VCO) 10 may generate a frequency for an RF signal according to an input control voltage. Since the output frequency of the VCO 10 is generally too high to be directly compared, a divider (DIV) (or counter) 12 may be used to divide the output frequency into a lower frequency.

A reference frequency Ref generated from a crystal oscillator such as a temperature compensated X-tal oscillator (TCXO) 11 may be compared to an output frequency from the DIV 12. Through this, the frequency and phase difference are measured, and a difference between the two can be controlled by a feedback loop of the PLL.

The phase detector 13 compares the divided signal from the DIV 12 with a reference frequency to detect a phase difference. A charge pump (CP) 14 may generate a pulse train based on the difference, and the pulse train may increase or decrease a control voltage of the VCO 10 depending on its size and direction.

The pulse train generated by the CP 14 is smoothly filtered through a loop filter (LPF) 15. The filter 15 may remove noise and generate a stabilized control voltage signal.

The control voltage generated by the LPF 15 is fed back to the VCO 10 to regulate the frequency of the VCO 10. For example, as the control voltage increases, the frequency of the VCO 10 also increases, and conversely, as the control voltage decreases, the frequency decreases.

The output frequency of the VCO 10 generated in the previous step may be input back to the DIV 12 and compared. Through this process, the PLL may maintain the required frequency in the loop.

Figure 2:
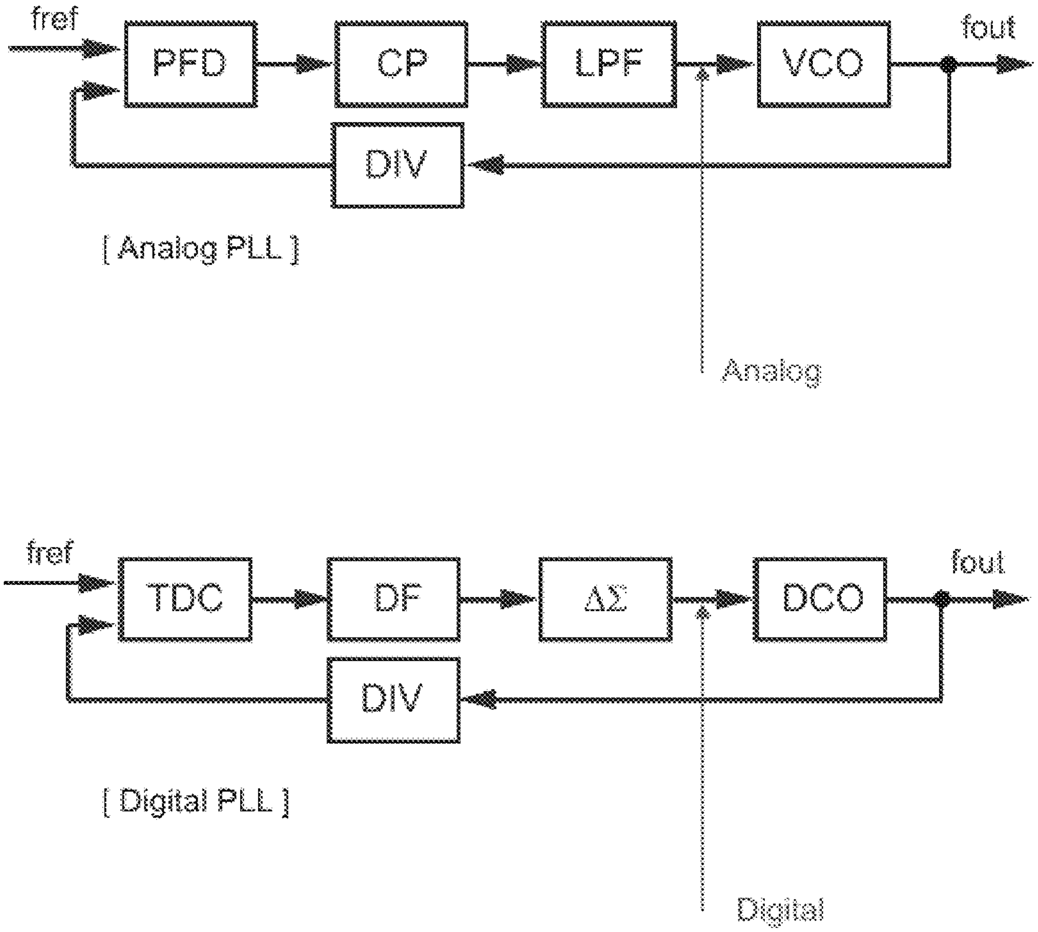
FIG. 2 is a diagram illustrating an analog PLL and a digital PLL to which the present specification may be applied.

FIG. 2 is a diagram illustrating an analog PLL and a digital PLL to which the present specification may be applied.

The analog PLL processes a series of analog signals. The frequency and phase changes may be tracked continuously through an analog circuit. The digital PLL uses digital sampling and digital signal processing. The analog input may be digitally sampled through analog-to-digital conversion (ADC) and then processed with digital signal processing.

Referring to FIG. 2, the analog PLL supplies an input signal fref and a VCO output signal to a phase frequency detector (PFD), and the PFD detects the phase difference and frequency difference. The output of the PFD moves to the CP, and the CP may convert the output into a current signal and transmit the current signal to the LPF. The LPF converts the current signal into a control voltage, which is applied to the VCO. The VCO regulates the output frequency according to the input control voltage, and the VCO output is fed back to the PFD through the DIV. This feedback loop continues to operate so that the phase and frequency between the input signal and the VCO output signal may be matched.

The digital PLL supplies the input signal fref and the feedback signal to a time-to-digital converter (TDC). The TDC converts the time difference between the input signal fref and the feedback signal into a digital value. The converted time difference is input to a digital loop filter (DF), which may track and control the frequency and phase difference using digital signal processing algorithms. A digital control signal generated by the DF may be converted into an analog control voltage through a sigma-delta digital-to-analog converter (sigma-delta DAC). The analog control voltage may be applied to a digitally-controlled oscillator (DCO) to regulate an output frequency of the DCO. The output frequency of the DCO is divided through the DIV, and this feedback signal may be fed back to the TDC. Through this, the loop is adjusted to minimize the phase and frequency differences, and the synchronization between the input and feedback signals may be maintained. In addition, digital code values may be stored in a memory, and the stored values may be protected using a locking code.

The crystal oscillator generally used as the VCO is located in a relatively high price range, and is relatively large in size, so there may be a problem in that the crystal oscillator is not suitable when products have space constraints.

Figure 3:
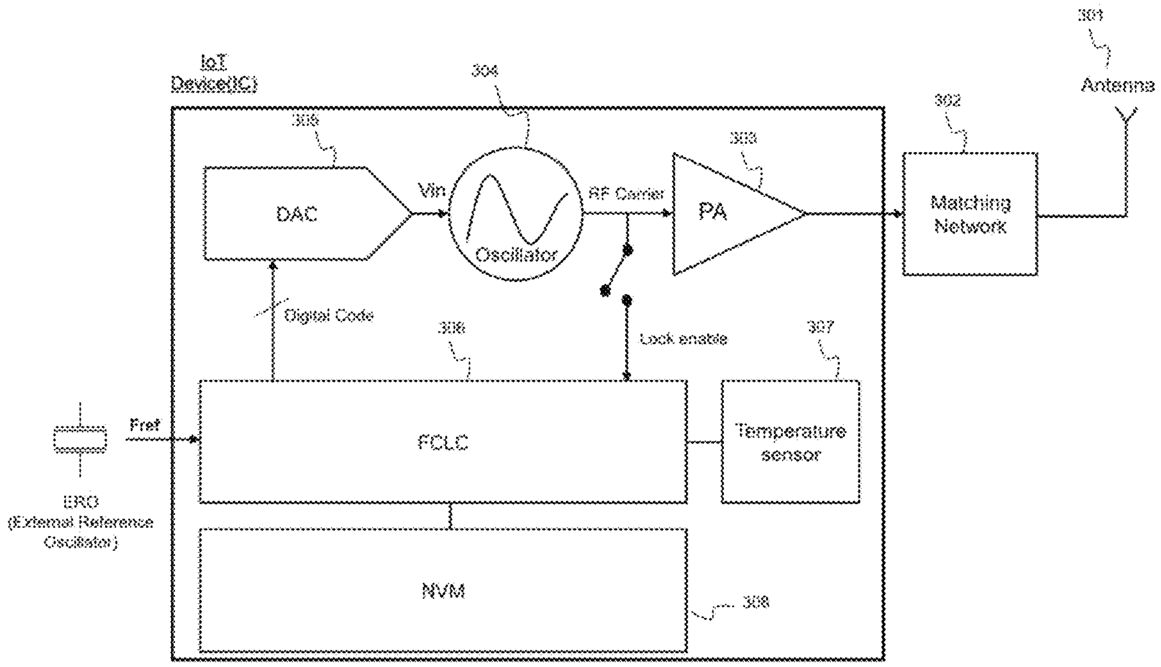
FIG. 3 is a diagram illustrating an RF transmitter including a crystal-less voltage controlled oscillator (VCO) to which the present specification may be applied.

FIG. 3 is a diagram illustrating an RF transmitter including a crystal-less VCO to which the present specification may be applied.

FIG. 3 illustrates a crystal-less RF transmitter that may be included in an Internet of things (IoT) device.

The IoT device is a device that enables collection and exchange of data through internetworking of physical devices, vehicles, buildings, and other items with built-in electronics, software, sensors, actuators, and network connections. The IoT device may provide advanced connectivity of devices, systems, and services including various protocols, domains, and applications, in addition to machine-to-machine (M2M) communication.

The IoT device may be encapsulated in various devices such as cardiac monitoring implants, biochip transponders in farm animals, automobiles with built-in sensors, automation of lighting, heating, ventilation, and air conditioning (HVAC) systems, and home appliances such as a washer/dryer, a robotic vacuum cleaner, an air purifier, an oven, or a refrigerator/freezer using wireless fidelity (Wi-Fi) for remote monitoring. For example, the IoT device may include a wireless sensor or a network of such sensors.

In addition, the IoT device may include an RF transmitter to collect data and transmit such data to a central controller.

The crystal-less RF transmitter exemplified in the present specification includes an antenna 301 that broadcasts a generated RF signal into space or transmits the generated RF signal to a receiver, a matching network 302 that performs impedance matching between an output of a power amplifier (PA) 303 and the antenna 301, a power amplifier 303 that amplifies the RF signal to convert into sufficient power, a digitally controlled oscillator (DCO) 304 that generates a frequency, does not include a crystal, and digitally controls the output frequency, a digital-to-analog converter (DAC) 305 that converts a digital code into an analog signal, a frequency control and locking circuit (FCLC) 306 that is a core circuit responsible for frequency control and locking of the RF transmitter, a temperature sensor 307, and a non-volatile memory (NVM) (or memory) 308 that stores a digital code table for frequency locking depending on temperature.

The FCLC 306 may control an output frequency of the DCO 304 according to a digital input value, monitor and compensate temperature dependence of the frequency through the temperature sensor 307, and provide a frequency locking function to maintain the desired frequency.

To this end, the NVM 308 may store a digital code table for frequency locking depending on temperature.

Figure 4:
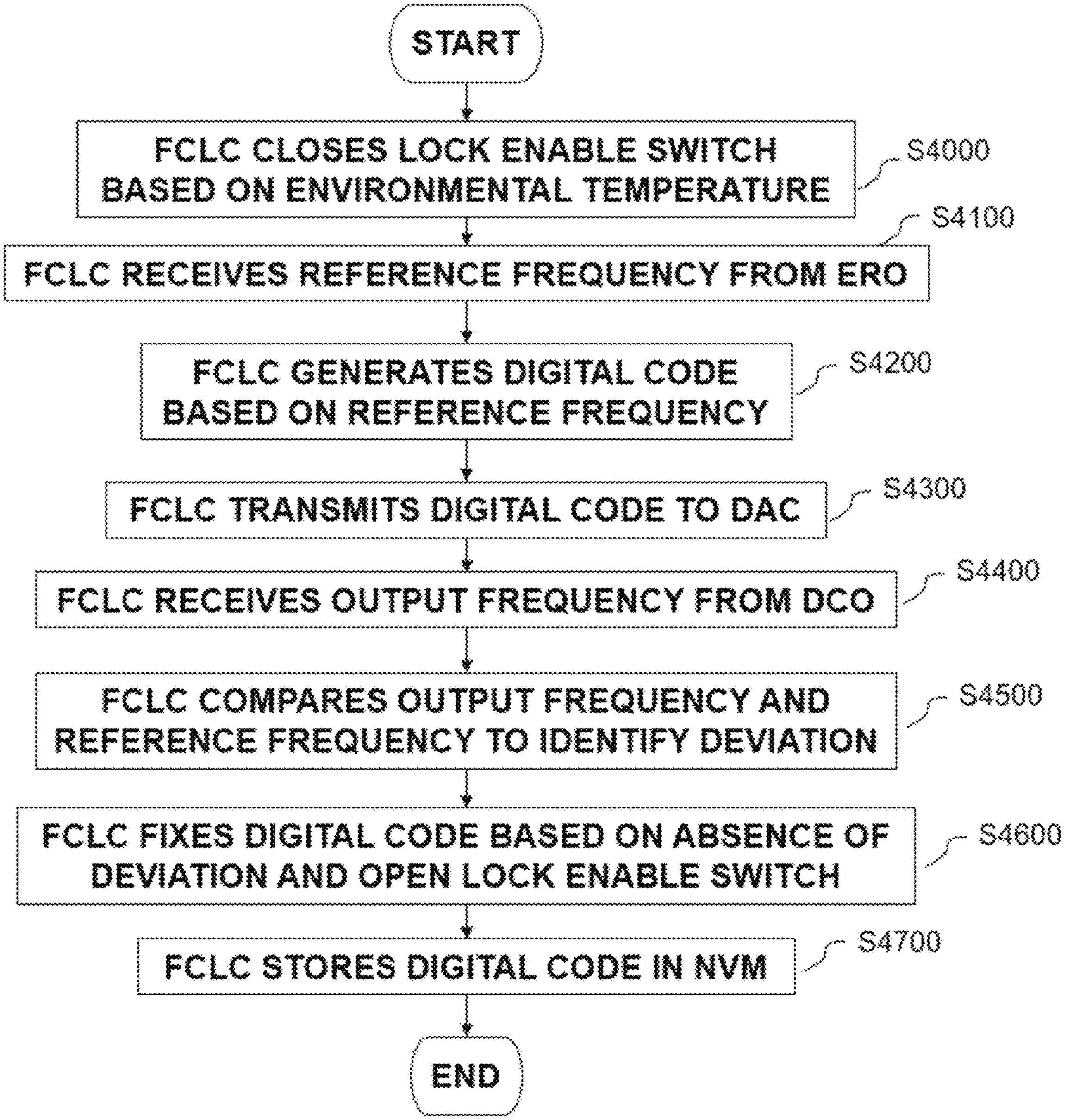
FIG. 4 is a diagram illustrating a method of correcting a frequency of a crystal-less RF transmitter, to which the present specification may be applied, depending on temperature.

FIG. 4 is a diagram illustrating a method of correcting a frequency of a crystal-less RF transmitter, to which the present specification may be applied, depending on temperature.

Correcting the frequency of the crystal-less RF transmitter depending on temperature is an important process to maintain signal stability and reliability, and may be performed using components illustrated in FIG. 3.

Referring to FIG. 4, in order to correct the frequency temperature of the crystal-less RF transmitter, the crystal-less RF transmitter may have an environment with a variable temperature. For example, the temperature may increase proportionally from low temperature to high temperature (e.g., 0°→5°→10°), which may affect the frequency of the crystal-less RF transmitter.

Based on the environmental temperature, the FCLC closes a lock enable switch (S4000). For example, the FCLC may close the lock enable switch to perform a temperature compensation operation according to the set environmental temperature value. In this way, the frequency temperature compensation is activated.

The FCLC receives a reference frequency from an external reference oscillator (ERO) (S4100). The FCLC may receive the reference frequency, which is an accurate reference frequency, from the ERO.

The FCLC generates a digital code based on the reference frequency (S4200).

For example, the FCLC may generate a digital code for frequency correction according to the currently set temperature value based on the reference frequency. The digital code represents frequency regulation and may be set differently depending on temperature.

The FCLC transmits the digital code to the DAC (S4300).

For example, the generated digital code may be transmitted to the DAC and converted into an analog control voltage. The control voltage may control the DCO that is a frequency generator.

The FCLC receives the output frequency from the DCO (S4400).

The DCO may regulate the frequency based on the analog control voltage received from the DAC and generate the resulting output frequency. The FCLC may receive, measure, and record the output frequency.

The FCLC compares the output frequency and the reference frequency to identify a deviation (S4500). The deviation may indicate whether the correction of the output frequency is necessary. For example, when there is the deviation, the FCLC may generate the corrected digital code to eliminate the deviation, pass the generated digital code to the DAC, receive the output frequency, and compare the output frequency and the reference frequency to identify the deviation again.

The FCLC fixes the digital code based on the absence of the deviation and opens the lock enable switch (S4600). When there is no deviation, the FCLC may fix the corresponding digital code and open the lock enable switch. As a result, the frequency at the set temperature value may be stabilized.

The FCLC stores the digital code in the NVM (S4700). For example, the FCLC may store the digital code in the NVM along with the temperature value of the corresponding environmental temperature.

By increasing the temperature value from low temperature to high temperature, the FCLC may repeat the above-described operation. In this way, the FCLC may generate a look up table (LUT). The FCLC may track frequency correction values according to a change in temperature through the LUT and may be used when necessary.

Figure 5:
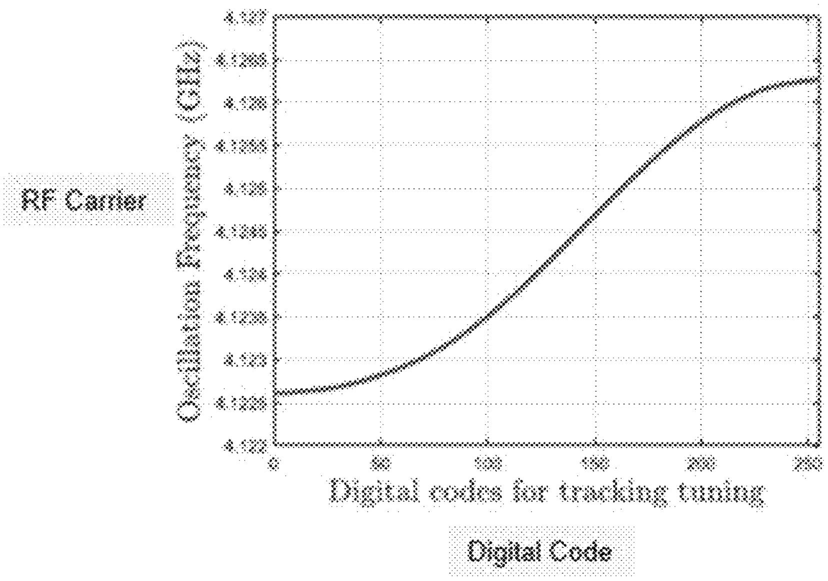
FIG. 5 is an example of locking digital code tracking to which the present specification may be applied.

FIG. 5 is an example of locking digital code tracking to which the present specification may be applied.

Referring to FIG. 5, by tracking the fixed digital code, the generated LUT may include digital codes for various temperature ranges. The digital code included in the LUT may be used to correct the output frequency at a specific temperature. For example, the output frequency at high temperature may be regulated higher, and the output frequency at low temperature may be adjusted lower.

Referring again to FIG. 4, the FCLC may provide the above-described frequency locking function to maintain the desired frequency. In this way, the RF transmitter of the present specification may reduce the effect of frequency according to the change in temperature to maintain the stability.

Figure 6:
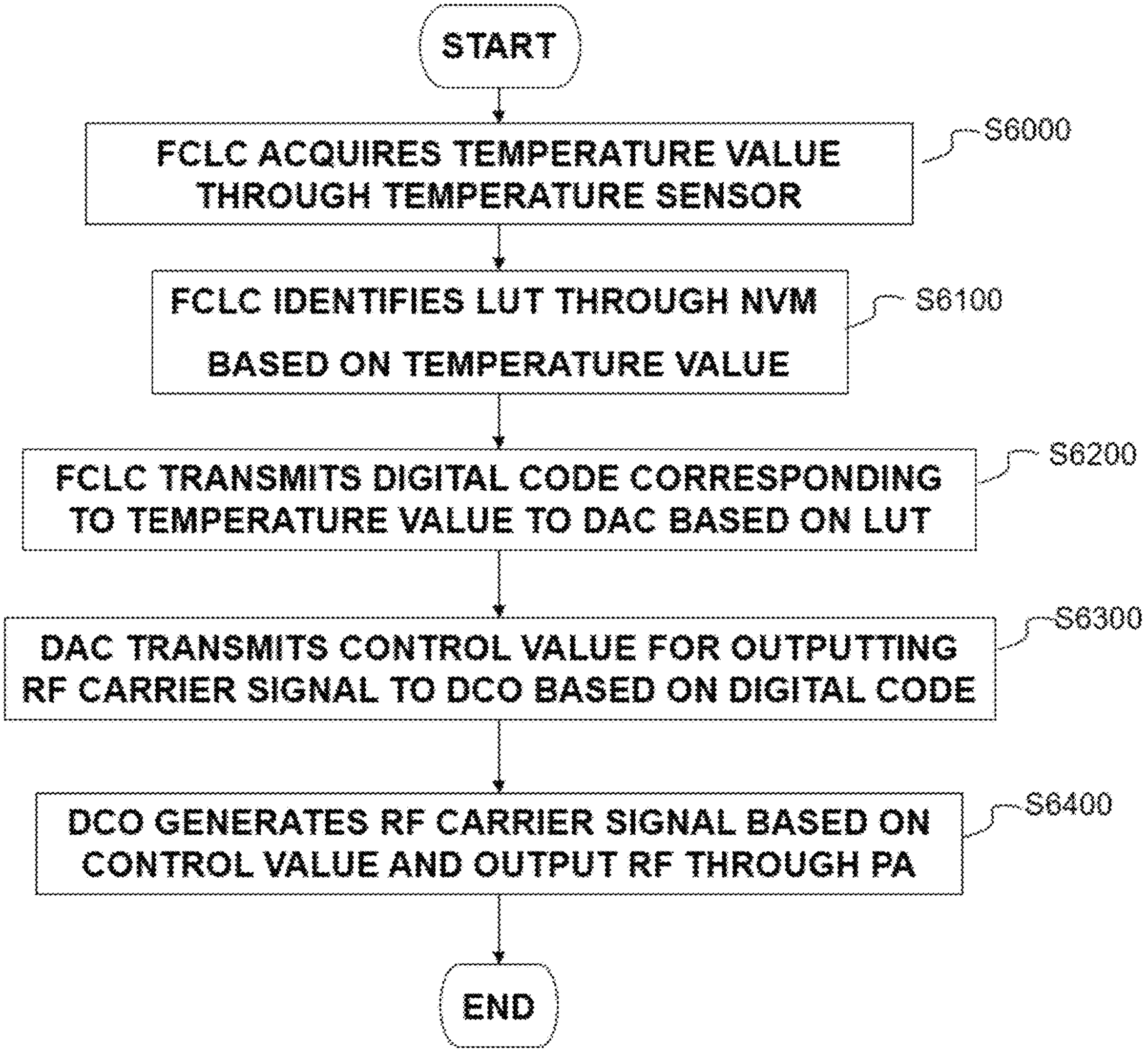
FIG. 6 is an embodiment of an RF transmitter to which the present specification may be applied.

FIG. 6 is an embodiment of an RF transmitter to which the present specification may be applied.

Referring to FIG. 6, the RF transmitter may include all or some of the components of FIG. 3 and may include the LUT generated through the operation of FIG. 4.

The FCLC acquires a temperature value through a temperature sensor (S6000). For example, the temperature sensor may measure the environmental temperature of the RF transmitter and generate the temperature value of the environmental temperature.

The FCLC checks the LUT through the NVM based on the temperature value (S6100).

The NVM may include the LUT generated through the frequency temperature correction operation of FIG. 4.

The FCLC transmits the digital code corresponding to the temperature value to the DAC based on the LUT (S6200). For example, the digital code may represent a control value to regulate the output frequency of the DCO.

Based on the digital code, the DAC transmits a control value for outputting the RF carrier signal to the DCO (S6300). The DAC may interpret a digital code, convert the digital code into an analog control voltage Vin, and transmit the analog control voltage to the DCO as the control value. The analog control voltage may be used to regulate the RF carrier signal of the DOC.

Based on the control value, the DCO generates the RF carrier signal and outputs the RF through the PA (S6400). The RF carrier signal is amplified through the PA and transmitted to the antenna, and the RF transmitter may output the RF through the antenna.

Accordingly, the RF transmitter may perform communication without the crystal oscillator, and pads connected to the crystal oscillator may be removed, resulting in reducing the size of the IoT device.

Since the IoT device proposed in the present specification does not include connection circuits (or pads) for connection to the crystal oscillator, electro-magnetic interference (EMI) that may be generated by the connection circuits can be reduced, an electrostatic discharge (ESD) protection circuit for protecting these connection circuits cannot be required, and the space for the layout of the connection circuits can also be reduced, and thus, the IoT device can be manufactured lightly, thinly, and compactly.

Accordingly, since the process of manufacturing the IoT device can be simplified, manufacturing costs can be reduced, and there is no limitation on the form factor because there is no crystal oscillator, there is an advantage that the IoT device can be miniaturized and manufactured in the form of a label tag.

In the embodiments described hereinabove, components and features of the present specification are combined with each other in a predetermined form. It is to be considered that the respective components or features are selective unless separately explicitly mentioned. The respective components or features may be implemented in a form in which they are not combined with other components or features. In addition, some components and/or features may be combined with each other to configure the embodiment of the present specification. A sequence of operations described in the embodiments of the present specification may be changed. Some components or features of any embodiment may be included in another embodiment or be replaced by corresponding components or features of another embodiment. It is obvious that claims that do not have an explicitly referred relationship in the claims may be combined with each other to configure an embodiment or be included in new claims by amendment after application.

Embodiments of the present specification may be implemented by various means, for example, hardware, firmware, software, a combination thereof, or the like. In the case in which an embodiment of the present specification is implemented by the hardware, it may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

According to the embodiment of the present specification, it is possible to provide an RF transmitter capable of communicating without a crystal oscillator.

Effects which can be achieved by the present specification are not limited to the above-described effects. That is, other objects that are not described may be obviously understood by those skilled in the art to which the present specification pertains from the following description.

In the case in which an embodiment of the present specification is implemented by the firmware or the software, it may be implemented in the form of a module, a procedure, a function, or the like, performing the functions or the operations described above. A software code may be stored in a memory and be driven by a processor. The memory may be positioned inside or outside the processor and transmit and receive data to and from the processor by various well-known means.

It is obvious to those skilled in the art that the present specification may be embodied in another specific form without departing from the essential feature of the present specification. Therefore, the above-mentioned detailed description is to be interpreted as being illustrative rather than being restrictive in all aspects. The scope of the present specification is to be determined by reasonable interpretation of the claims, and all modifications within an equivalent range of the present specification fall in the scope of the present specification.

What is claimed is:

1. A crystal-less radio frequency (RF) transmitter for correcting a frequency depending on temperature, the RF transmitter comprising:

an antenna configured to transmit an RF signal;

a temperature sensor configured to measure an ambient temperature of the RF transmitter;

a digitally controlled oscillator (DCO) that does not include a crystal and is configured to digitally control an output frequency for the RF signal;

a frequency control and locking circuit (FCLC) configured to perform frequency locking related to correction of the output frequency, wherein the FCLC is configured to:

close a lock enable switch based on the ambient temperature to activate a frequency correction operation;

receive a reference frequency from an external reference oscillator (ERO);

generate a digital code based on the reference frequency;

provide the digital code to a digital-to-analog converter (DAC) such that the digital code is converted into an analog control voltage for controlling the DCO;

receive the output frequency from the DCO;

compare the output frequency with the reference frequency to identify a deviation;

when the deviation exists, generate a corrected digital code to eliminate the deviation, provide the corrected digital code to the DAC, receive a resulting output frequency from the DCO, and compare the resulting output frequency with the reference frequency;

fix the digital code based on an absence of the deviation;

store the fixed digital code in association with a corresponding temperature value to generate a look-up table (LUT); and provide, based on the LUT, a digital code corresponding to an ambient temperature measured by the temperature sensor;

the DAC configured to provide a control voltage to the DCO based on the digital code received from the FCLC; and a non-volatile memory configured to store the LUT.

2. The RF transmitter of claim 1, wherein the FCLC is configured to repeatedly generate the corrected digital code, provide the corrected digital code to the DAC, receive the resulting output frequency from the DCO, and compare the resulting output frequency with the reference frequency until the deviation is absent.

3. The RF transmitter of claim 2, wherein the FCLC is configured to fix the digital code based on determining that the deviation is absent and open the lock enable switch after fixing the digital code.

4. The RF transmitter of claim 3, wherein the LUT includes digital codes respectively generated for a plurality of temperature values increasing from a lower temperature to a higher temperature.

5. The RF transmitter of claim 4, wherein the FCLC is configured to:

perform the frequency correction operation while increasing a temperature value from the lower temperature to the higher temperature;

for each of the plurality of temperature values, fix a corresponding digital code based on an absence of the deviation between the output frequency and the reference frequency; and store each fixed digital code in association with a corresponding one of the plurality of temperature values to generate the LUT.

* * * * *